United States Patent [19]
Adamian et al.
[11] Patent Number: 5,034,708
[45] Date of Patent: Jul. 23, 1991

[54] PROGRAMMABLE BROADBAND ELECTRONIC TUNER

[75] Inventors: Vahe' A. Adamian, Lexington; Peter V. Phillips, Leominster, both of Mass.

[73] Assignee: Automatic Testing and Networking, Inc., Woburn, Mass.

[21] Appl. No.: 561,259

[22] Filed: Jul. 30, 1990

Related U.S. Application Data

[63] Continuation of Ser. No. 352,576, May 16, 1989, abandoned.

[51] Int. Cl.[5] ...................... H01P 1/185; G01R 27/04
[52] U.S. Cl. .................................... 333/161; 333/164; 333/262; 333/263; 324/637; 324/646
[58] Field of Search ............... 333/104, 161, 164, 205, 333/245, 246, 262, 263, 81 A; 334/56-58, 71; 324/58 B, 58.5 B, 637-639, 642, 645, 646; 352/576

[56] References Cited

U.S. PATENT DOCUMENTS 3,295,138 12/1966 Nelson ........................... 333/164 X
3,454,906 7/1969 Hyltin et al. ........................ 333/164
4,425,633 1/1984 Swain ............................. 333/164 X
4,450,419 5/1984 Schwarzmann ................ 333/246 X
4,843,358 6/1989 Meise et al. ......................... 333/263
4,939,485 7/1990 Eisenberg ........................... 333/104

FOREIGN PATENT DOCUMENTS 99402 5/1986 Japan .................................. 333/263

*Primary Examiner*—Paul Gensler
*Attorney, Agent, or Firm*—Wolf, Greenfield & Sacks

[57] ABSTRACT

A programmable microwave network test device is capable of establishing a multitude of reflection and transmission coefficients determined by a set of digital inputs. The programmable network enables the collection of groups of measurements which are used to characterize a non-linear or linear device. The microwave structure of the network is comprised of a series of PIN diodes interconnected through microstrip transmission lines. The lengths of the transmission lines between the PIN divide are proportioned so as to allow use of the network over a broad frequency range, with a minimization of repeated reflection coefficients in a use of the network, the device to be characterized would be placed at the input port of the network with the output port of the network terminated in its characteristic impedance.

6 Claims, 5 Drawing Sheets

FREQUENCY = 6 GHz

FREQUENCY = 11 GHz

FREQUENCY = 12 GHz

FREQUENCY = 18 GHz

PROGRAMMABLE BROADBAND ELECTRONIC TUNER

This application is a continuation of application Ser. No. 352,576, filed May 16, 1989 now abandoned.

BACKGROUND OF THE INVENTION

This invention relates to a broadband, digitally controlled impedance network capable of producing a multitude of complex reflection and transmission coefficients for use in characterization of non-linear power or low noise linear transistors. Both power and noise characterization of the transistors requires measurement to be done under various loading conditions.

Engineers traditionally require noise-figure and gain circle data from an active device when a two-port network such as a low noise amplifier (where the information is used to optimize gain and noise figure) is designed. In a digital communication system, excessive noise interferes with a receiver's ability to differentiate between high (a digital "1") and low (a digital "0") level data bit. Excessive noise raises the system's bit-error rate and this results in lost information. In an analog radar system, for example, noise degrades the receiver's overall sensitivity. Excessive noise limits the radar receiver's ability to extract signal information from the system noise floor, and results in ambiguous returns and undetected threats.

Microwave load dependent devices and circuits can be accomplished by terminating the device in a mechanically or electromechanically controlled network consisting of continuously variable tuners, attenuators and phase shifters. Measurements must also be made at various load conditions to properly characterize these low noise or power devices. The measurements referred to above are accomplished by inserting a device called a tuner on the input and output of a transistor. The input tuner is adjusted for minimum noise figure and the output tuner for maximum available gain at minimum noise figure. These measurements are referred to as "Source-pull" measurements.

The noise figure of the transistor as a function of source admittance is given by the following formula:

$$F = F\text{min} + (Rn/Gs)\,|Ys - Y\text{opt}|^2$$

where F is the device noise factor as a function of source admittance, Fmin is the minimum noise figure from the device under test (DUT), and Yopt is the complex source for minimum noise figure. Rn is the equivalent noise resistance or the parameter which defines the sensitivity of noise figure to changes in the Ys, the source admittance. In the foregoing equation, Gs is the source conductance. Yopt is itself made up of two scalar values, as follows:

Yopt = Gopt + jBopt

Gopt = Optimum source conductance

Bopt = Optimum source susceptance

Gain parameters calculated are based on the following formula:

$$1/G = 1/G\text{max} + (Rg/Gs)\,|Ys - Y\text{opt}|^2$$

where Gmax is the maximum available gain achievable from the DUT, Yopt is the complex source admittance for maximum available gain, Gmax, and Rg is the equivalent gain resistance or the parameter which defines the sensitivity of available gain to changes in source admittance.

The traditional prior art means of varying source impedance is with a mechanical tuner. Unfortunately, mechanical tuners do not offer long-term stability, since they must be adjusted manually before each measurement and thus are not suitable for automatic testing use.

The basic theories under which noise measurement are assessed and descriptions of operative devices are given in: Adamian, V., "*Stable Source Aids Automated Noise-Parameter Measurements,* "MSN+CT, February 1988, pp. 51-58 and Froelich, R. K., *Automated Tuning for Noise Parameter Measurements Using a Microwave Probe*, Microwave Journal, March 1989, pp. 83.96.

One example of a programmable, solid state two port microwave network is disclosed in U.S. Pat. No. 4,502,028. This patent discloses a tuner using a plurality PIN diodes positioned behind a 3 dB Coupler, two 4.7 dB Couplers and a fixed Phase Shifter set for 45 degrees at the center of the operating frequency range. The impedance states are selected by turning on the PIN diodes in various combinations. As disclosed in the referenced patent, PIN diodes have low capacitance and very high impedance when reverse biased and can also withstand large RF voltages. In the above-referenced patent, a PIN diode effectively acts as an open circuit or a short circuit to an RF signal depending on the biasing of the diode. The device disclosed by the above patent suffers from the small number of load conditions (limited to the number of diodes to the power of two) a limited frequency range (one octave or less) and limited maximum reflection magnitude (0.707 maximum due to coupling networks). Providing an electronically controllable impedance network with a large number of load conditions, a broad frequency range, and maximum reflection greater than prior art devices would enhance the ability to automate the test process and increase the speed of measurement.

Mechanically controlled networks afford wide frequency range but suffer from slow transition time from one state to another. Such mechanically controlled tuners use stepper motors to move a metallic probe in a slab line structure to create the Voltage Standing Wave Ratio (VSWR) discontinuity. Mechanical systems wear, repeatability is a problem, and their speed will not compete with solid state tuner devices.

SUMMARY OF THE INVENTION

The invention discloses a programmable broadband, highly reflective two-port microwave network for use in the characterization of microwave circuits and devices. The network includes a multitude of digitally programmed current controlled PIN diodes separated by microstrip transmission lines of specific proportional length and digitally controlled phase shift circuitry. A multitude of reflection and transmission coefficients comprising discrete amplitudes with similar phase occur in response to various programmable current levels applied through a selected PIN diode. Further, a multitude of reflection and transmission coefficients comprising discrete phases with similar amplitude occur in response to digitally selecting each of the PIN diodes with or without the phase shift circuit. The programmable two-port network dis closed herein provides the capability of presenting complex impedances over nearly all the reflection plane bounded by magnitude of 1 for multi-octave frequency ranges with rapid random access of any available impedance state.

BRIEF DESCRIPTION OF THE DRAWINGS

Other and further features and advantages of the invention are illustrated through the accompanying drawings wherein.

DESCRIPTION OF THE PREFERRED EMBODIMENT

Figure 1:
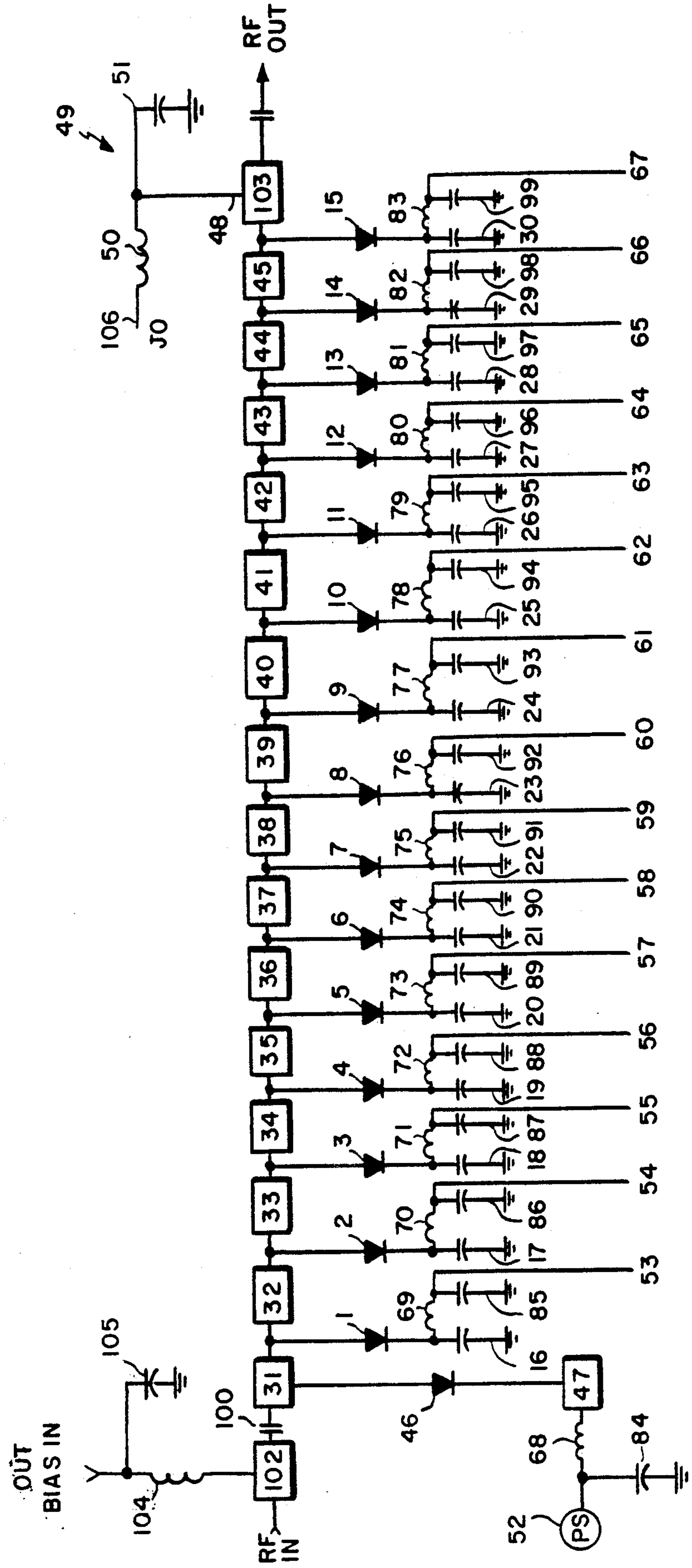
FIG. 1 shows a schematic of the microwave circuitry used to establish the microwave portion of the invention.

Referring now to FIG. 1, there is shown a schematic of the microwave circuitry contained in the programmable broadband, highly-reflective two-port microwave network. The microwave network comprises a plurality (in the preferred embodiment 15) PIN diodes, herein denoted as 1 through 15, each connected in series with a DC blocking capacitor, herein denoted as 16 through 30, shunted to ground. The letters PIN denote a three layer semiconductor structure consisting of heavily P doped semiconductor material, an intervening undoped intrinsic (I) layer in which charge is stored and a heavily N doped semiconductor material. A PIN diode exhibits low capacitance and high resistance when reverse-biased. As the PIN is forward biased, its resistance becomes lower and lower until it reaches a very small resistance (nearly a short circuit) at full forward-bias. Each of the series PIN capacitor structures 1 through 15 and 16 through 30 are separated by lengths of characteristic impedance transmission lines, such as 50 ohm microstrip transmission line herein denoted as 31 through 45, constructed from 10 mil thick microstrip substrate laminated with 1 oz. rolled copper clad both sides. A phase shift circuit is comprised of beam lead diode 46 and capacitor 47 formed by a 10 mil by 15 mil pad on the microstrip substrate.

Still referring to FIG. 1, a DC bias current can be supplied to any of the activated diodes 46 and 1 through 15 at connection 48 through point 106 (JO) and RF bypass network 49 formed by RF coil 50 and shunt capacitor 51. This DC bias current appears at the anode of all diodes 46, and 1 through 15. Diodes 46 and 1 through 15 can be activated by providing a DC current path through the respective connections at 52 (point PS) and at points 53 through 67. The current path is established by providing a DC return path to ground on the control line PS at 52 or 53 through 67 associated with the diode to be activated. The series RF coils 68 through 83 in conjunction with shunt capacitors 84 through 99 form RF bypasses to prevent interaction between RF and DC circuitry. The capacitors, here in denoted as 100 and 101, placed in series with the microstrip transmission lines prevent the diode DC bias current from exiting the network. Transmission lines, denoted at 102 and 103, are arbitrary lengths of characteristic impedance line allowing for connection into the network via coaxial interfaces.

Still referring to FIG. 1, the network additionally provides for an input for DC bias to be presented to the device connected to the network's input port. RF coil 104 with shunt capacitor 105 comprise an RF bypass to prevent the RF from interacting with the DC bias source.

The network described herein provides for a multitude of unique complex impedances over a broad frequency range covering multiple octaves. The proper selection of length for each of the transmission lines 31 through 45 ensures a unique phase relationship between each of the PIN diodes, 1 through 15. A key contribution of the tuner is in the selection of the lengths of the transmission lines 31 through 45 between the PIN diodes 46 and 1 through 15.

If the line lengths are not properly established, then it is possible that at some frequencies within the tuner's operating range more than one diode may provide the same impedance value. When this occurs, there are then less available impedance states and limited coverage of the full impedance plane. To ensure that this grouping or repetition of impedance values is minimized and in most cases eliminated, the present invention sets the lengths of the transmission line to avoid the repetition and grouping problem.

Correct line length relationship will minimize the possibility that at some frequency within the network's operating range more than one diode may provide the same impedance value. This invention discloses a relative length relationship for transmission lines 31 through 45 based on the principle of prime numbers. This principle minimizes the grouping or repetition of impedance values over a multi-octave frequency band, as shown in FIG. 4 and described below. The repetition of impedance values occurs when the total line length of the round-trip travel from network input port to a given diode Di compared to the round-trip travel from the input to another diode Dj is such that at the current operating frequency the number of wavelengths contained in each of the two paths can be evenly divided into each other thus creating the same phase angle. Employing a prime number relationship ensures that each total line length from the network input to each diode is not evenly divisible by any other.

The following equations illustrate the process for calculating the lengths of the interconnecting transmission lines:

Desired Frequency Range: 2 to 18 GHz

Substrate Material: 10 mil Duroid 5880 Er=2.2

Characteristic Impedance: Z0=50 ohms

1. Determine effective dielectric constant of 50 ohm line in 10 mil Duroid 5880;

$$Erp = \left(\frac{Er+1}{2}\right) + \left(\frac{Er-1}{2}\right)\left(1 + 12\frac{H}{W}\right)^{-\frac{1}{2}}$$

where

H=substrate thickness=10 mils

W=line width=32 mils for Z0=50

2. Calculate necessary electrical length for lowest operating frequency;

$L1 = 360/(N \times 1.2 \times F\text{start})$ 2 way length in Air in meters where N=Total number of PIN diodes used Fstart=Start Frequency in MHz 3. Calculate the total electrical length for each PIN diode activated using the prime number relationship;

$$Li = -I \times L1 \times PNi/(2.54 \times 2(\text{Erp})^{\frac{1}{2}})$$ 1 way length in Dielectric in inches where I=number of diodes 1 to N PNi=next prime number in sequence 4. Individual transmission line lengths are then given by $$T_{i,\,i+1} = |L_{i+1} - L_i|$$ spacing in inches between Diodes Di and Di+1 where i=1 to N−1

To understand the contribution of the tuner to the present invention, the objectives of the measurement to be performed must be realized.

There are several parameters that exist in the microwave and RF fields that allow for description of the performance of an electrical device or component. One parameter is the noise parameter. This parameter is utilized to describe how a transistor or amplifier behaves with regard to waveforms carrying desired information (signals) and random waveforms (noise). An ideal transistor or amplifier would treat both signals and noise equally, thus having the same proportion of signal and noise at its output that it had at its input. In reality, this is not always the case, and the signal to noise proportion shifts more toward the noise. The quantity called the noise figure is used to express how the signal to noise ratio at the input compares with the same ratio at the device output. The noise figure varies as a function of the impedance presented at the input of the device.

The role of the present invention is to determine what is the impedance value, that when presented at the device input, provides the optimum best that is, (lowest) possible noise figure. To accomplish this, the present invention presents a number of different impedances provided by the tuner of the present invention at the device input and measures its noise figures. From their impedance it can be determined in a conventional manner the optimum impedance needed at the device input to establish the best noise figure.

The best measurement results occur when the optimum impedance value is surrounded by the impedance points used during the measurement. Because each device being tested will have a different set of optimum impedance values at the frequencies being measured, it is desirable to be able to present actual impedance values over all parts of the impedance plane. This is the primary goal of the present invention tuner, to be able to present as many different impedances as possible spread across the impedance plane.

If the impedance values are thought of in the complex form of reflection coefficient, magnitude (varying from 0 to 1) and phase (varying from 0 to 359 Degrees), we can attempt to see how the present invention tuner provides from a variety of impedance values. The present invention tuner consisting of both the microwave circuitry (Diodes and Transmission Lines, etc.) and the DC controlling circuitry has the capability of Providing for specific values of magnitude and phase. The phase provided by the tuner is determined by the PIN diode currently activated via the DC peripheral drivers and the total length of transmission line between the tuner input and the activated PIN diode. In addition, this value of phase may also be altered if the phase shifter has been activated as well. The proper combination of transmission line lengths allows for unique phase locations to exist for each diode at each operating frequency. The magnitude provided by the tuner is primarily dependent upon the amount of current being passed through the activated PIN diode. This current level is determined by the digitally controlled current source in the DC control circuitry as explained below. Secondarily, the magnitude is also a function of the attenuation suffered by traveling through the total length of transmission line between the tuner input and the activated PIN diode.

Figure 3:
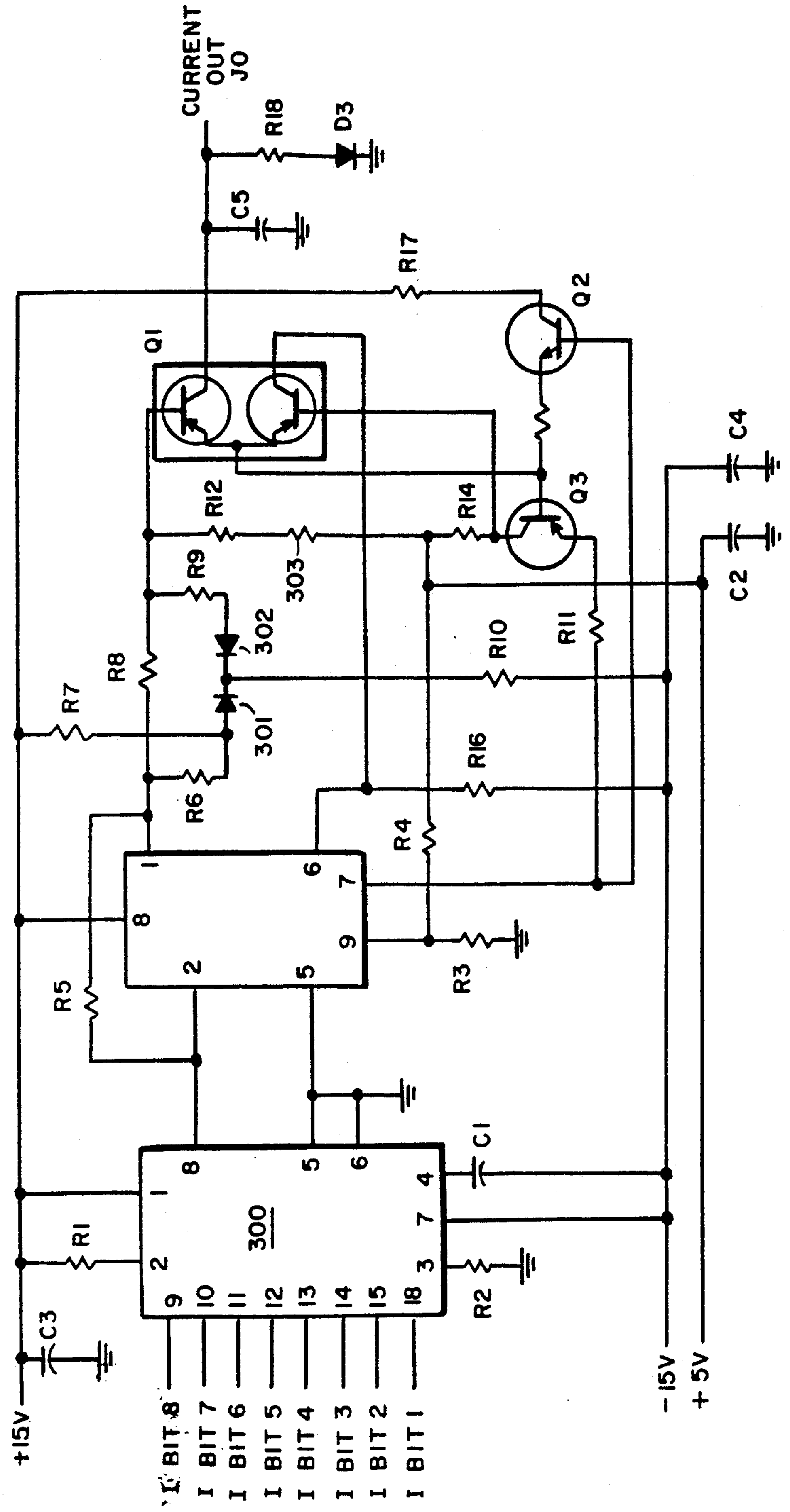
FIG. 3 shows a schematic of the digital controlled current driver used to bias the PIN diodes contained in the microwave portion of the invention.
Figure 4A:
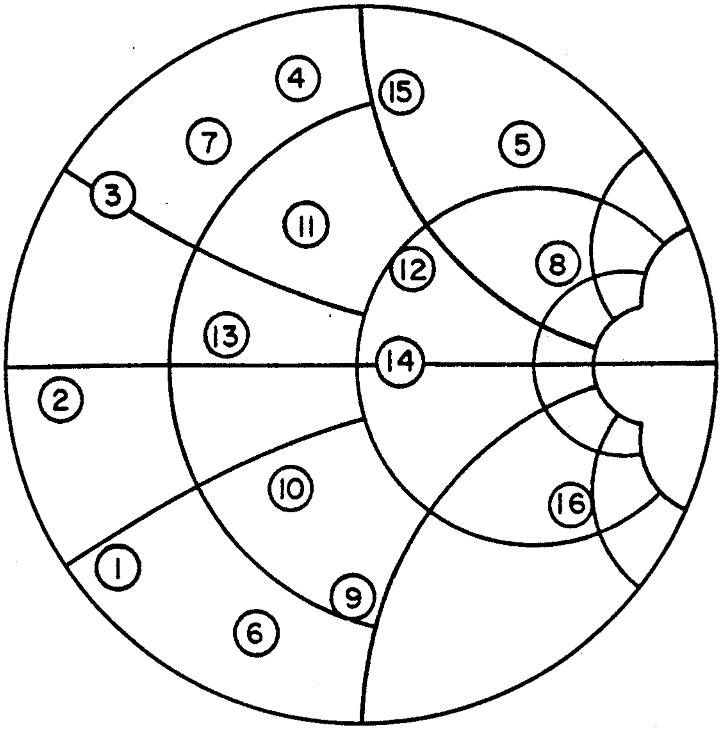
FIGS. 4(*a*) to 4(*d*) show in a graphic format the results of testing performed with the preferred embodiment of the present invention.
Figure 4B:
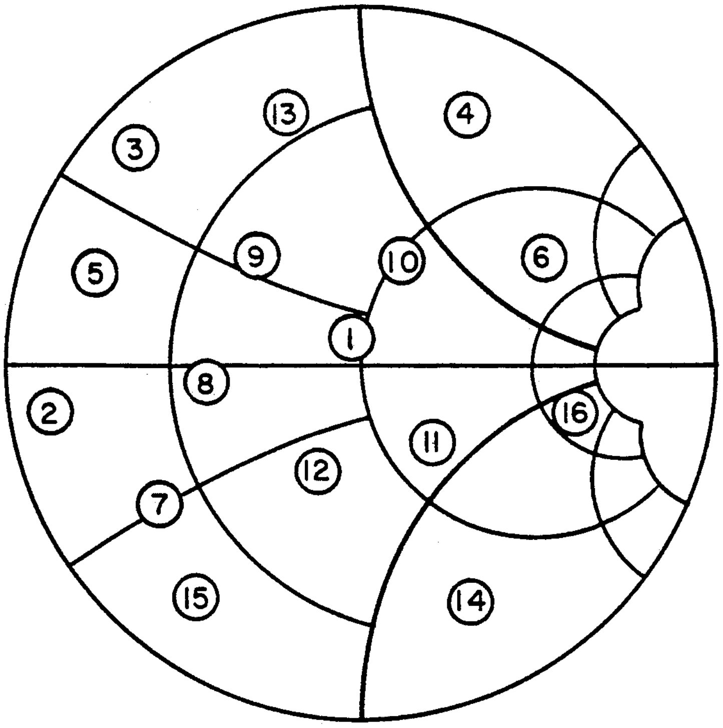
Figure 4C:
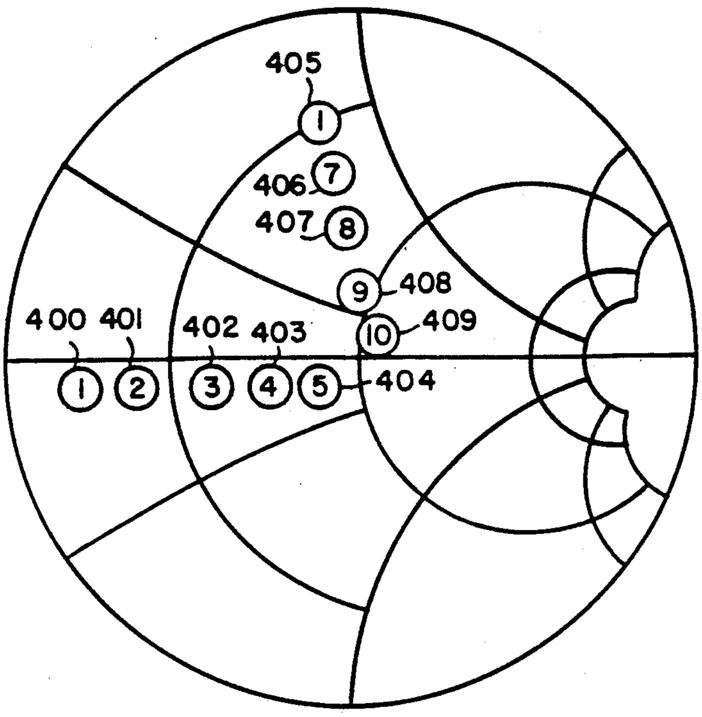
Figure 4D:
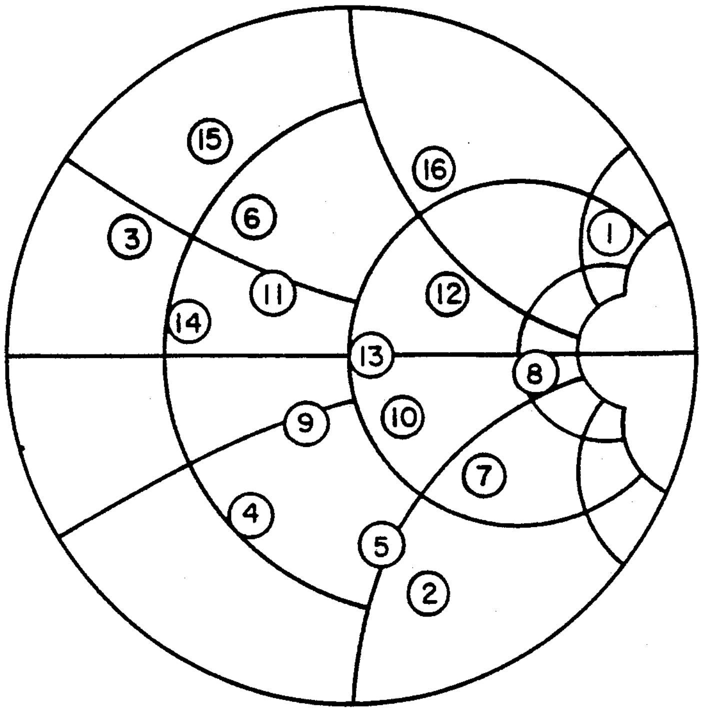

In order to ensure repeatable impedance values, it is useful to provide an ovenized housing and temperature compensation in the current device circuit of FIG. 3 of the preferred embodiment.

The tuner of the present invention operates in normal use as a one port device, such that it features only one RF connection port. It also has the the capability of being used as a two port THRU line when in the 50 ohm state, that is, with no diodes activated. This feature may be employed to allow the connection of a vector network analyzer to the DUT without having to disconnect the tuner of the present invention.

Figure 2:
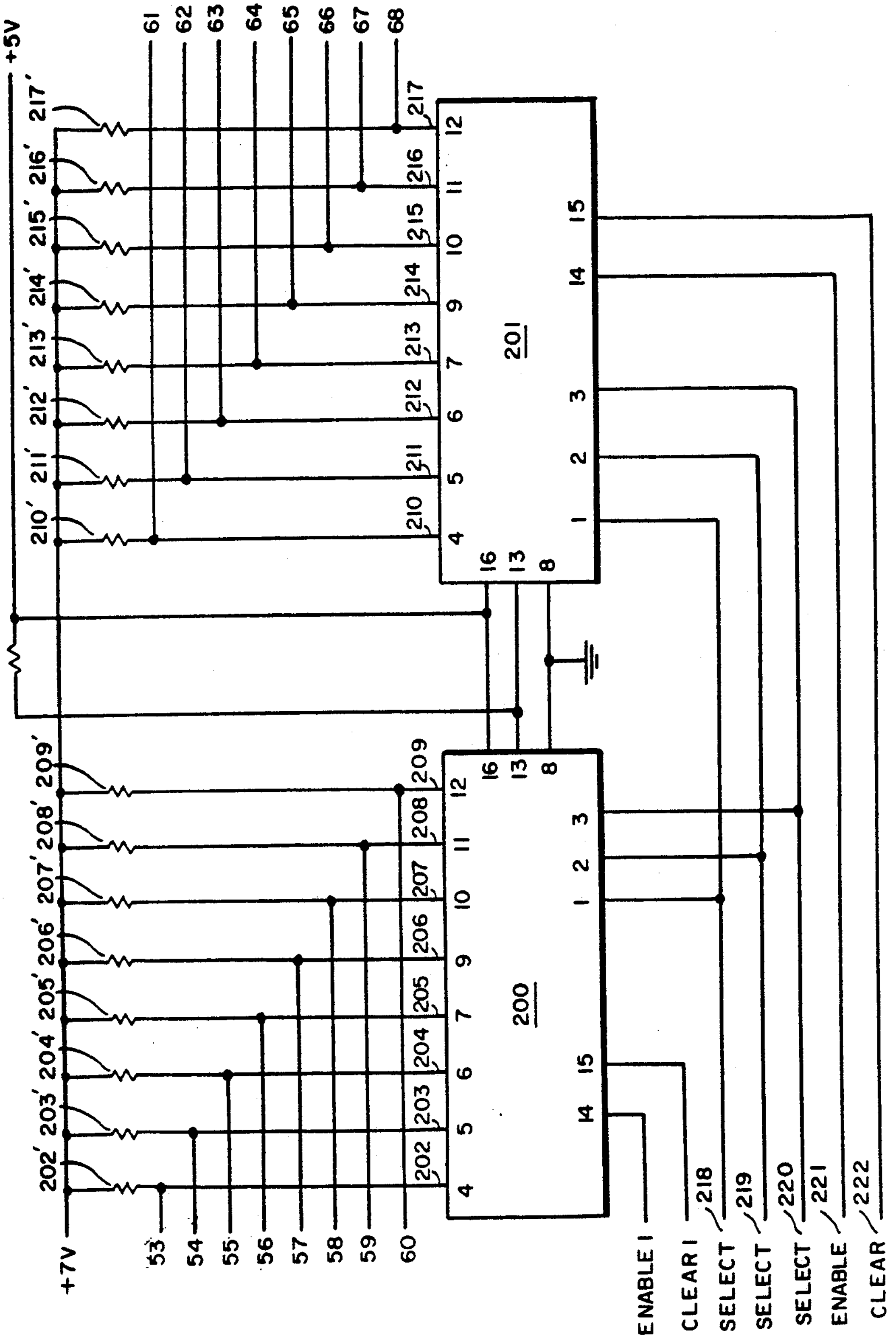
FIG. 2 shows a schematic of the digital control circuitry used to select or activate any of the multitude of PIN diodes and phase shift circuit contained in the microwave portion of the invention.

Referring now to FIG. 2, representing the diode selection circuitry, there is shown a schematic of the digital circuitry employed for the activation of a selected PIN diode 1 through 15 and phase shift circuit diode 46. The commercially available NE590 peripheral driver integrated circuits manufactured by Signetics Corporation of Sunnyvale, Calif., herein denoted as 200 and 201, are configured to operate in a demultiplex manner allowing for one of their eight output lines (202-217) to be switched to ground while the remaining lines float as open collectors. The 4.7 ohm resistors 202 to 217 placed between each output of 200 and 201 and the +7 volt bias act as pull up networks for each unselected output thus ensuring a reverse bias is maintained on each unselected PIN diode, 1 through 15. In order to select one of the eight outputs of 200 and 201, a three bit word ranging from zero to seven must be presented at Selects 218, 219, 220 while both the Enable (221) and Clear (222) lines for the appropriate peripheral driven (200, 201) are held at a logic low state. The output selected will then remain switched to ground when both the Enable 221 and Clear 222 lines are switched to a logic high state. Returning all peripheral drives outputs to the open collector state can be accomplished by holding the Enable 221 high and the Clear 222 low. Performing this on both ICs will reverse bias all RF diodes 46 and 1 through 15, thus providing a through path for RF from Network input to output. Any of the PIN diodes 46 and 1 through 15 can be activated via proper control of the two Peripheral device ICs. Normally only one of the PIN diodes would be activated at any one time. The phase shift circuit can also be activated by forward biasing diode 46 through connection 52. Once the phase shift circuit is activated, any of the PIN diodes 1 through 8 can be selected using 200. Diodes 9 through 15 cannot be accessed at this time as 201 is committed to activating the phase shift circuit.

The phase provided by the network is primarily determined by which PIN diode is currently activated by the control circuitry of FIG. 2. In addition, this phase value may be altered by activating the phase shift circuit along with the selected PIN diode.

Referring now to FIG. 3, there is shown a schematic of a digitally programmable current driver employed to provide a specified level of current flow at point 106 in FIG. 1. This current is used to bias any of the diodes 46 and 1 through 15 which are presently activated. The driver has the capability for providing 256 discrete current levels determined via an eight bit word ranging in value from 0 to 255 presented at the input lines denoted as I Bit 1 through I Bit 8 of the Digital-to-Analog Converter (DAC) denoted as 300. Through control of this DAC, the current source provides a second order linearized output via a current-mirror circuit with breakpoints set by diodes 301 and 302. The current level is also temperature compensated by thermistor 303. This circuit used as a source of bias for PIN diodes 1 through 15 provides for discrete, linearly-spaced steps of increased reflection magnitude and decreased transmission magnitude in the microwave portion of the network, depicted in FIG. 1, as the current level is increased. Through this circuit, the magnitude of the resultant impedance value can be programmed in discrete increments.

The Diode Selection Circuitry of FIG. 2 together with the Digital Control Current Driver of FIG. 3 form a pair of 256 by 8 matrices allowing a PIN diode to be activated and then a specified bias current to be applied through this activated diode. This configuration of PIN diodes, Phase Shift circuit and DC select matrix enable the selection of impedance values at discrete phase locations with discretely stepped magnitude values. The present network configuration has the potential to provide as many as 5889 impedance values at any frequency over its multi-octave operating range. The phase of the selected impedance value is primarily determined by the total length of transmission line between the network input and the activated PIN diode and additionally upon the phase shift circuit if it is activated. The magnitude of the selected impedance value is primarily dependent upon the amount of current being passed through the activated PIN diode and secondarily upon the total attenuation of the RF path from the network input to the activated diode.

Referring now to FIGS. 4(*a*) to 4(*d*), there is illustrated in graphic format (in the form of a Smith chart) the reflection coefficients of the programmable microwave network A realization of the preferred embodiment of the present invention is manufactured and sold by the assignee of the present invention, Automatic Testing and Networking, Inc. of Woburn, Mass., under the model designation NP4. The NP4 operates in the frequency range of 2 to 18 GHz. For the sake of simplicity in the illustrations, measurements were made at 6, 11, 12 and 18 GHz.

For each of the frequencies, a number of points were generated, as denoted as numbered and circled 1 through 16 (except in FIG. 4(*c*) with only 10 points) representing sixteen reflection coefficients. In actual use of the device, the various frequencies may be plotted on one Smith chart, but they are separated in FIG. 4 for purposes of illustration.

For any given frequency the optimum impedance for minimum noise figure of a linear two-port can be anywhere on the Smith Chart. For this reason it is ideal that the source impedances are distributed throughout the four quadrants of the chart.

FIG. 4(*c*) shows five different impedance states for two different diodes. Points 400 through 404 are generated by using different current values in one of the diodes. As can be seen, as the current is decreased, the points move toward the center of the Smith Chart, that is from point 400 toward point 404. Phase is shifted by turning off the first diode and applying current to the second diode. Points 405 through 409 represent decreasing current values through this second diode. In addition, the phase can also be shifted by using one diode and activating the phase shift circuit. Therefore, with the present invention, due to its versatility, by varying the selected diode, as well as the current values through the diode, and activating the phase shift circuit, a great number of reflection coefficients can be generated.

While the foregoing invention has been described with reference to its preferred embodiments, variations and modifications will occur to those skilled in the art. Such variations and modifications are intended to fall within the scope of the appended claims.

What is claimed is:

1. A programmable microwave network for establishing a plurality of reflection and transmission coefficients comprising:

- a tuner comprising a plurality of PIN diodes operatively connected through predetermined physical lengths of a microstrip transmission line;
- means for providing a plurality of digital signals to the tuner;
- digital control means to drive at least one of the PIN diodes through the digital signals to produce a plurality of reflection and transmission coefficients;
- each of the PIN diodes being spaced from adjacent PIN diodes by segments of the microstrip transmission line, the physical length of each of the segments in a given unit of measure being based upon a prime number relationship in which the length is derived from a discrete prime number so that the total line physical length from a network input of the plurality of PIN diodes to any one of the PIN diodes is not evenly divisible by the total line physical length from the input to any other of the PIN diodes.

2. The invention as claimed in claim 1 wherein the plurality of PIN diodes are designated Di to Di+1 and where the transmission line length T between PIN diodes Di and Di+1 in said prime number relationship is given by the formula:

$$Ti,i+=Li+1-Li$$

where i=1 to N−1;

and Li=−I×L1×PNi/(2.54×2(Erp)$^{\frac{1}{2}}$)

where I=the number of the diode, 1 to N and PNI=next prime number in sequence;

where L1=360/(N×1.2×Fstart)

Fstart=Start Frequency in MHz where N=Total number of PIN diodes used.

3. The invention as claimed in claim 1, including means for providing a phase shift signal to the tuner.

4. A tuner comprising:

a plurality of PIN diodes;

the PIN diodes being operatively connected to each other through predetermined physical lengths of microstrip transmission line;

each of the PIN diodes being spaced from adjacent PIN diodes by segments of the microstrip transmission line, the physical length of each of the segments in a given unit of measure being based upon a prime number relationship in which the length is derived from a discrete prime number so that the total line physical length from a network input of the plurality of PIN diodes to any one of the PIN diodes is not evenly divisible by the total line physical length from the input to any other of the PIN diodes.

5. The tuner of claim 4 wherein the plurality of PIN diodes are designated Di to Di+1 and wherein the transmission line length T between PIN diodes Di and DI+1 in said prime number relationship is given by the formula:

$$Ti,i+1=Li+1-Li$$

where i=1 to N−1;

and $Li=-I\times L1\times PNi/(2.54\times 2(Erp)^{\frac{1}{2}})$ where I=the number of the diode, 1 to N and PNi=next prime number in sequence;

where L1=360/(N×1.2×Fstart)

Fstart=Start Frequency in MHz where N=Total number of PIN diodes used.

6. A programmable microwave network for establishing a plurality of reflection and transmission coefficients comprising:

a tuner comprising a plurality of solid state switching means operatively connected through predetermined physical lengths of a transmission line;

means for providing a plurality of digital signals to the tuner;

digital control means to drive at least one of the solid state switching means through the digital signals to produce a plurality of reflection and transmission coefficients;

each of the solid state switching means by segments of the transmission line, the physical length of each of the segments in a given unit of measure being based upon a prime number relationship in which the length is derived from a discrete prime number so that the total line physical length from a network input of the plurality of solid state switching means to any one of the solid state switching means is not evenly divisible by the total line physical length from the input to any other of the solid state switching means.

* * * * *

UNITED STATES PATENT AND TRADEMARK OFFICE
CERTIFICATE OF CORRECTION

PATENT NO. : 5,034,708

DATED : July 23, 1991

INVENTOR(S) : Vahé A. Adamian and Peter V. Phillips

It is certified that error appears in the above-identified patent and that said Letters Patent is hereby corrected as shown below:

Col. 10, line 13 last paragraph, after the word "means" please insert --being spaced from each adjacent solid state switching means--

Signed and Sealed this

Twenty-ninth Day of December, 1992

Attest:

DOUGLAS B. COMER

*Attesting Officer* *Acting Commissioner of Patents and Trademarks*